United States Patent
Iida

(10) Patent No.: US 6,947,457 B2
(45) Date of Patent: Sep. 20, 2005

(54) DFB LASER DRIVING DEVICE, DFB LASER DRIVING METHOD AND STORAGE MEDIUM

(75) Inventor: Rikihiro Iida, Kanagawa (JP)

(73) Assignee: Yokogawa Electric Corporation, Tokyo (JP)

(*) Notice: Subject to any disclaimer, the term of this patent is extended or adjusted under 35 U.S.C. 154(b) by 544 days.

(21) Appl. No.: 09/781,049

(22) Filed: Feb. 9, 2001

(65) Prior Publication Data

US 2001/0036211 A1 Nov. 1, 2001

(30) Foreign Application Priority Data

Feb. 14, 2000 (JP) ................................. P.2000-035408

(51) Int. Cl.[7] ............................................. H01S 3/00
(52) U.S. Cl. ................................. 372/38.02; 372/38.01
(58) Field of Search ........................... 372/38.01, 38.02, 372/34, 29.015

(56) References Cited

U.S. PATENT DOCUMENTS

| | | | | |
|---|---|---|---|---|
| 5,019,769 A | * | 5/1991 | Levinson ................... | 372/38.1 |
| 5,383,208 A | | 1/1995 | Queniat et al. | |
| 6,101,210 A | * | 8/2000 | Bestwick et al. ............. | 372/96 |
| 6,195,370 B1 | | 2/2001 | Haneda et al. | |
| 6,229,832 B1 | * | 5/2001 | Baba et al. ............. | 372/29.011 |
| 6,301,280 B1 | * | 10/2001 | Broutin et al. ........... | 372/38.01 |
| 6,389,046 B1 | * | 5/2002 | Stayt et al. ............. | 372/29.011 |
| 6,400,737 B1 | * | 6/2002 | Broutin et al. ................ | 372/20 |
| 6,449,077 B1 | * | 9/2002 | Broutin et al. ................ | 372/32 |
| 6,563,846 B1 | * | 5/2003 | Kuo et al. ............... | 372/29.02 |

FOREIGN PATENT DOCUMENTS

| EP | 0 793 316 A1 | 9/1997 |
|---|---|---|
| EP | 0 913 896 A2 | 5/1999 |
| WO | WO99/14832 | 3/1999 |

* cited by examiner

*Primary Examiner*—Minsun Oh Harvey
*Assistant Examiner*—Cornelius H. Jackson
(74) *Attorney, Agent, or Firm*—Fish & Richardson P.C.

(57) ABSTRACT

When set values of a wavelength and a output level are input, the input set values (of the wavelength and the output level) are collated with data (A), and then, an approximate temperature of a DFB laser is calculated. The calculated approximate temperature is collated with data (B), and then, a output regulation value of the DFB laser is calculated. The input set value (the output level) is added to the power regulation value, and then, an optical output controlling value is calculated. The optical output level of the DFB laser is controlled. The optical output controlling value and the input set value (of the wavelength) are collated with the data (A), and then, a temperature controlling value of the DFB laser is calculated. Consequently, the temperature of the DFB laser is controlled.

3 Claims, 6 Drawing Sheets

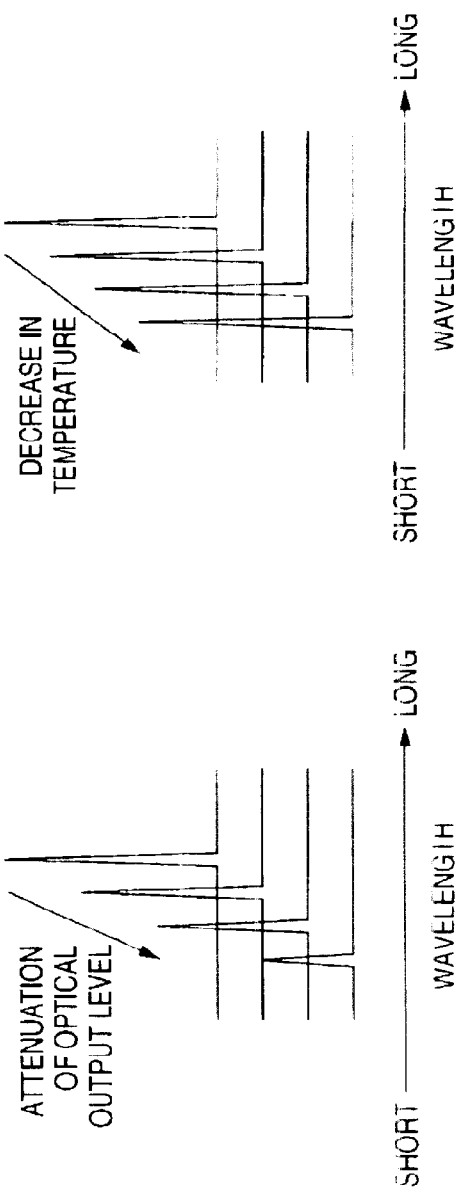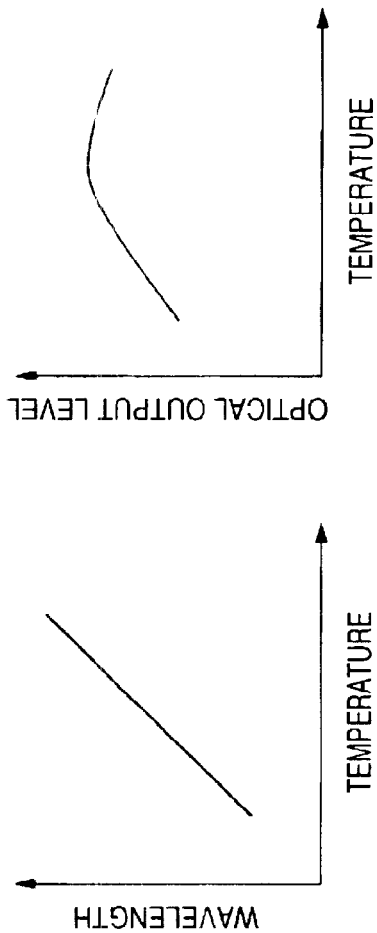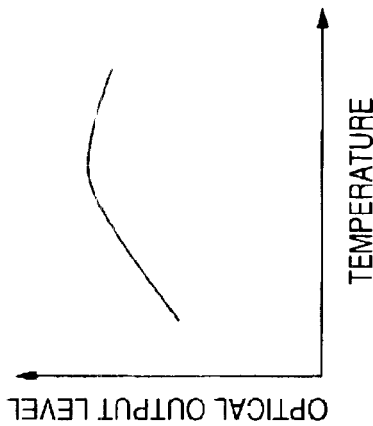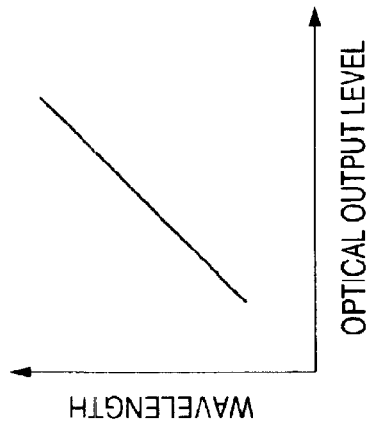

DFB LASER DRIVING DEVICE, DFB LASER DRIVING METHOD AND STORAGE MEDIUM

BACKGROUND OF THE INVENTION

1. Field of the Invention

The present invention relates to a DFB laser driving device, a DFB laser driving method and a storage medium for use in a DWDM (Dense Wavelength Division Multiplexing) communication system and a device for testing the same or the like.

2. Description of the Related Art

In recent years, a dense wavelength division multiplexing (DWDM) communication system has been used in long-haul large-capacity communications.

In the DWDM communication system, the communications are achieved such that the wavelengths of a plurality of optical signals different in wavelength are multiplied in an optical fiber serving as a transmission path by using, as a carrier signal, a light beam emitted from a light source such as a distributed feedback laser diode (hereinafter referred to as a DFB laser) for emitting a laser beam in a single wavelength.

In the DWDM communication system, since the wavelengths of the optical signal and the carrier signal are synthesized at an input terminal of the optical fiber while the wavelength is divided at an output terminal of the optical fiber, it is necessary to strictly control the wavelength of the DFB laser as the carrier signal.

Furthermore, a plurality of optical amplifiers are provided on the transmission path, for amplifying the carrier signal, and therefore, it is necessary to strictly control also the optical power level of the carrier signal.

Referring to FIG. 4, explanation will be made on a conventional DFB laser driving device 200.

The DFB laser driving device 200 illustrated in FIG. 4 comprises a DFB laser 1, a Peltier device 2, a thermistor 3, a photodiode 4, a laser driving circuit 5, an optical output controlling D/A converter 6, a temperature control circuit 7, a CPU 90, a storage device 10, a storage medium 11 and an interface 12.

The DFB laser 1 is driven such that when optical output setting information is input into the CPU 90 via the interface 12, the CPU outputs an optical output control signal (a digital signal) to the optical output controlling D/A converter 6 based on the optical output setting information and data of an optical output level stored in the storage medium 12 inside the storage device 10.

Subsequently, the optical output controlling D/A converter 6 converts the optical output control signal (the digital signal) into an analog signal to output the analog signal to the laser driving circuit 5. The laser driving circuit 5 outputs a drive current to the DFB laser 1, and thereafter, the DFB laser 1 outputs optical output.

Furthermore, the temperature control circuit 7 cools the DFB laser 1 by applying a current to the Peltier device 2 based on a temperature controlling reference voltage input into an input terminal thereof and a feedback signal input from the thermistor 3, thereby controlling the DFB laser 1 at a constant temperature.

FIG. 5 graphically illustrates the relationships among the wavelength, optical output level and temperature of a laser beam radiated from the DFB laser 1.

As illustrated in FIGS. 5A and 5B, when the temperature of the DFB laser 1 is constant, the optical output level is attenuated according to a decrease in drive current of the DFB laser 1, and whereby the wavelength of the laser beam radiated from the DFB laser 1 is shifted toward a short wavelength side. In the meantime, as illustrated in FIGS. 5C and 5D, when the optical output level of the DFB laser 1 is constant, the temperature of the DFB laser 1 is decreased, and whereby the wavelength of the laser beam radiated from the DFB laser 1 is shifted toward a short wavelength side.

The relationship between the temperature and the optical output level of the DFB laser 1 generally shows that higher output is obtained at a lower temperature side. However, no predetermined regularity may be established between the temperature and the optical output level of the DFB laser 1 owing to variations in coupling efficiency between the radiated laser beam and the optical fiber (the transmission path) or the like caused by a change in wavelength of the radiated laser beam and a change in temperature of the DFB laser 1, as illustrated in FIG. 5E.

The DFB laser driving device 200 disposed at the input terminal of the transmission path needs to perform a "pre-emphasis" for regulating the optical output level of the carrier signal in order to keep a constant receiving level of the carrier signal assigned to the optical signal of each of the wavelengths at the output terminal of the transmission path in the DWDM communication system.

However, since the temperature of the DFB laser 1 is controlled at a constant value by the temperature control circuit 7 in the conventional DFB laser driving device 200, when the optical output level is regulated, there has arisen a problem of a change in wavelength of the radiated laser beam, as illustrated in FIG. 6.

Consequently, if the optical output level of the DFB laser 1 is regulated, there has arisen a problem of a shift of the wavelength of the carrier signal which is important in the DWDM communication system.

Moreover, since the characteristics of amplification rates of the plurality of optical amplifiers disposed on the transmission path in the DWDM communication system are varied according to the wavelength, there has been a possibility of deterioration of communication accuracy of the DWDM communication system.

An object of the present invention is to provide a DFB laser driving device, a DFB laser driving method and a storage medium for regulating an optical output level of a DFB laser without shifting a set wavelength.

Another object of the present invention is to strictly control an optical output level or wavelength of a DFB laser.

SUMMARY OF THE INVENTION

In order to solve the above-described problems, according to a first aspect of the invention, a DFB laser driving device (for example, corresponding to a DFB laser driving device 100 illustrated in FIG. 1) for driving a DFB laser (for example, corresponding to a DFB laser 1 illustrated in FIG. 1) to output optical signals having a predetermined wavelength and a predetermined power level, the DFB laser driving device comprises:

an input unit adapted to input set values of a wavelength and a output level (for example, corresponding to an interface 12 illustrated in FIG. 1);

an approximate temperature calculating section adapted to calculate an approximate temperature of the DFB laser based on the set values of the wavelength and output level (for example, corresponding to a CPU 9 illustrated in FIG. 1, and (1) in FIG. 2);

an output level variation calculating section adapted to calculate an output level variation of the DFB laser based on the approximate temperature (for example, corresponding to the CPU 9 illustrated in FIG. 1, and (2) in FIG. 2);

an output level controlling section adapted to calculate a calculated value based on the output level variation and the set value of the output level, so as to control the output level of the DFB laser based on the calculation value (for example, corresponding to the CPU 9 illustrated in FIG. 1, and (3) in FIG. 2); and a temperature controlling unit adapted to calculate a set temperature of the DFB laser based on the calculated value and the set value of the wavelength so as to control the temperature of the DFB laser based on the set temperature of the DFB laser (for example, corresponding to the CPU 9 illustrated in FIG. 1, and (4) in FIG. 2).

According to the first aspect of the invention, the input unit inputs the set values of the wavelength and the output level; the approximate temperature calculating section calculates the approximate temperature of the DFB laser based on the set values of the wavelength and output level input from the input unit; the output level variation calculating section calculates the output level variation of the DFB laser based on the approximate temperature calculated by the approximate temperature calculating section; the output level controlling section calculates the calculation value based on the output level variation calculated by the output level variation calculating section and the set value of the output level input from the input unit, so as to control the output level of the DFB laser based on the calculation value; and the temperature controlling section calculates the set temperature of the DFB laser based on the calculation value and the set value of the wavelength input from the input unit, so as to control the temperature of the DFB laser based on the set temperature.

According to a second aspect of the invention, a method for driving a DFB laser to output optical signals having a predetermined wavelength and a predetermined output level, the method comprises:

inputting set values of a wavelength and a output level;

calculating an approximate temperature of the DFB laser based on the set values of the wavelength and output level;

calculating an output level variation of the DFB laser based on the approximate temperature;

calculating a calculated value based on the output level variation and the set value of the output level;

controlling the output level of the DFB laser based on the calculated value;

calculating a set temperature of the DFB laser based on the calculated value and the set value of the wavelength; and controlling the temperature of the DFB laser based on the set temperature.

According to a third aspect of the invention, a storage medium storing therein a program, which can be executed by a computer, for driving a DFB laser to output optical signals having a predetermined wavelength and a predetermined output level, the program comprises:

inputting set values of a wavelength and a output level;

calculating an approximate temperature of the DFB laser based on the set values of the wavelength and output level;

calculating an output level variation of the DFB laser based on the approximate temperature;

calculating a calculated value based on the output level variation and the set value of the output level to obtain an calculated value;

controlling the output level of the DFB laser based on the calculated value;

calculating a set temperature of the DFB laser based on the calculated value and the set value of the wavelength; and controlling the temperature of the DFB laser based on the set temperature.

Thus, according to any one of the first to third aspects of the invention, the output level variation is calculated from the set value in consideration of change in temperature of the DFB laser to control the output level based on the calculation value calculated in a basis of the set value and the output level variation, thereby strictly controlling the output level of the DFB laser.

Furthermore, after controlling the output level, the temperature of the DFB laser is controlled, and whereby the wavelength of the DFB laser can be prevented from being shifted caused by the change in temperature. Accordingly, the wavelength can be strictly controlled.

Moreover, the approximate temperature of the DFB laser is calculated again based on the calculated output level, and further, the output level is calculated again, thereby more accurately controlling the output level of the DFB laser.

BRIEF DESCRIPTION OF THE DRAWINGS

FIG. 5 graphically illustrates the relationships among the wavelength, optical output level and temperature of a DFB laser 1.

DETAILED DESCRIPTION OF THE EMBODIMENTS

A description will be given of an embodiment according to the present invention in reference to FIGS. 1 to 3.

First, the configuration will be explained below.

Figure 1:
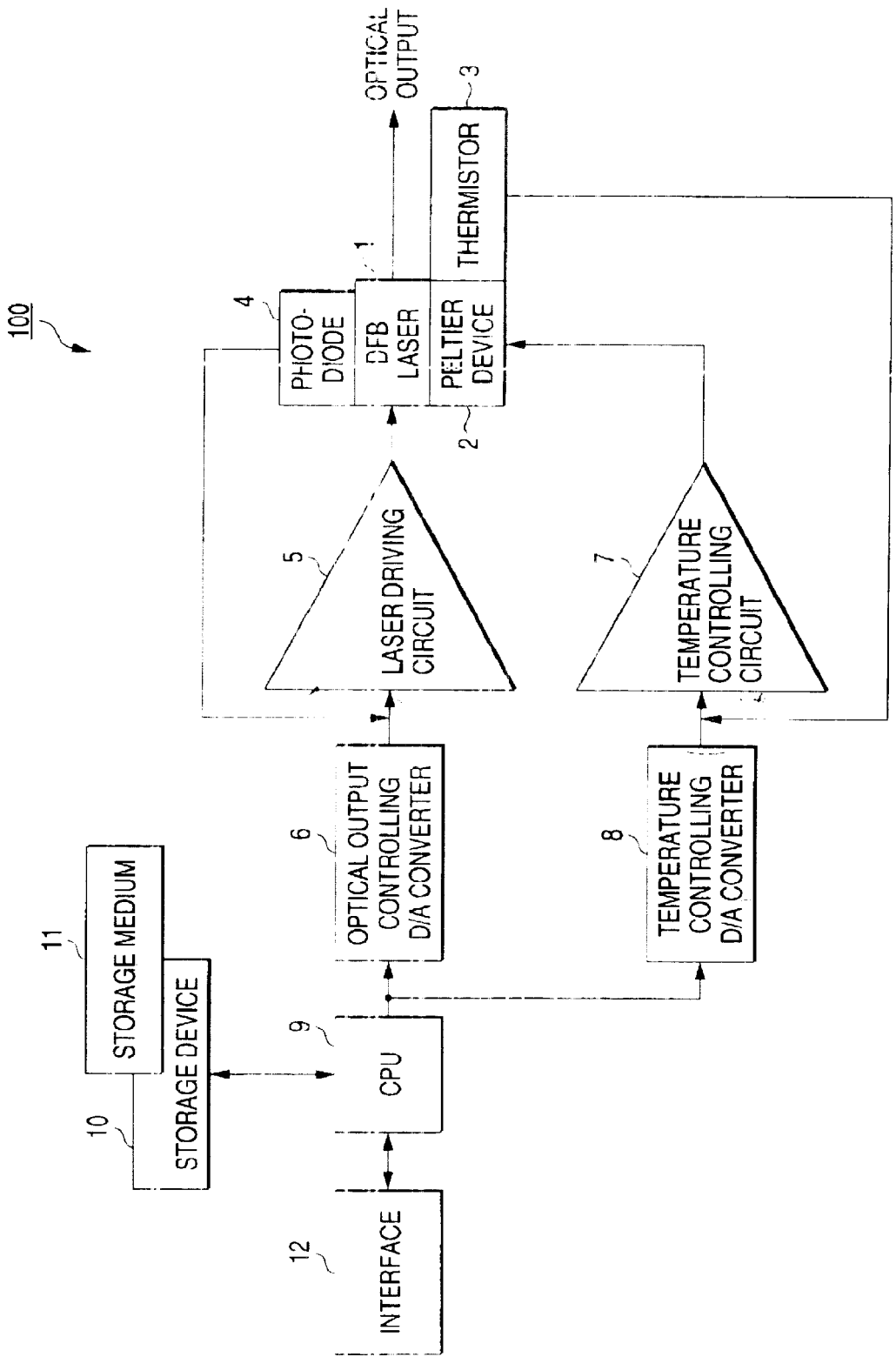
FIG. 1 is a block diagram illustrating the configuration of a DFB laser driving device 100 in a embodiment, to which the present invention is applied.

As illustrated in FIG. 1, a DFB laser driving device 100, to which the present invention is applied, comprises a DFB laser 1, a Peltier device 2, a thermistor 3, a photodiode 4, a laser driving circuit 5, an optical output controlling D/A converter 6, a temperature control circuit 7, a temperature controlling D/A converter 8, a CPU 9, a storage device 10, a storage medium 11 and an interface 12.

The DFB laser 1 is a laser diode for outputting an optical signal having a single wavelength according to an applied drive current when a drive current is applied by the laser driving circuit 5.

The Peltier device 2 is a device in which a temperature on one side (i.e., a surface in contact with the DFB laser 1) becomes low according to an applied current when a current is applied by the temperature control circuit 7, thereby cooling the DFB laser 1.

The thermistor 3 monitors the temperature of the DFB laser 1 to feed back a temperature monitoring signal to the temperature control circuit 7.

The photodiode 4 monitors the optical output level of the DFB laser 1 to feed back an optical output monitoring signal to the laser driving circuit 5.

The laser driving circuit 5 applies a drive current to the DFB laser 1 based on an optical output controlling value (analog) input from the optical output controlling D/A converter 6. Furthermore, the laser driving circuit 5 regulates a drive current amount in such a manner as that the optical output controlling value (analog) input from the optical output controlling D/A converter 6 and the optical output monitoring signal fed back from the photodiode 4 become equal to each other, thereby performing an automatic optical output control (APC: Auto Power Control) in which the optical power level of the DFB laser 1 is controlled.

The optical output controlling D/A converter 6 converts the optical output controlling value (digital) input from the CPU 9 into the optical output controlling value (analog) to output the optical output controlling value (analog) to the laser driving circuit 5.

The temperature control circuit 7 applies the current to the Peltier device 2 based on a temperature controlling value (analog) input from the temperature controlling D/A converter 8. Moreover, the temperature control circuit 7 regulates a current amount applied to the Peltier device 2 in such a manner as that the temperature controlling value (analog) input from the temperature controlling D/A converter 8 and the temperature monitoring signal fed back from the thermistor 3 become equal to each other, thereby performing an automatic temperature control (ATC: Auto Temperature Control) in which the temperature of the DFB laser 1 is controlled.

The temperature controlling D/A converter 8 converts the temperature controlling value (digital) input from the CPU 9 into the temperature controlling value (analog) to output the temperature controlling value (analog) to the temperature control circuit 7.

Upon receipt of set values of a wavelength and an optical output level from the interface 12, the CPU (Central Processing Unit) 9 calculates the optical output controlling value and the temperature controlling value based on data (FIGS. 2(A) and 2(B)) stored in the storage medium 11 inside the storage device 10 to output the optical output controlling value to the optical output controlling D/A converter 8 and to output the temperature controlling value to the temperature controlling D/A converter 6. Here, since the data stored in the storage medium 11 is discrete data, the CPU 9 uses interpolation method in calculating the optical output controlling value and the temperature controlling value.

The storage device 10 incorporates therein the storage medium 11. The storage medium 11 is composed of a magnetic storage medium, an optical storage medium, or a semiconductor memory. The storage medium 11 may be stationarily or detachably incorporated in the storage 10. Moreover, the storage medium 11 stores therein data on the temperature, optical output level and wavelength of the DFB laser 1 (see FIG. 2 (A)) and data on the temperature and optical output level of the DFB laser 1 (see FIG. 2(B)).

The interface 12 is connected to outside equipment to output various set values (of, e.g., the wavelength and the optical output level) of the optical signals input from the outside equipment to the CPU 9. Additionally, the interface 12 outputs control data or the like input from the CPU 9 to the outside equipment.

Next, a description will be given of the operation of the present embodiment.

Figure 2:
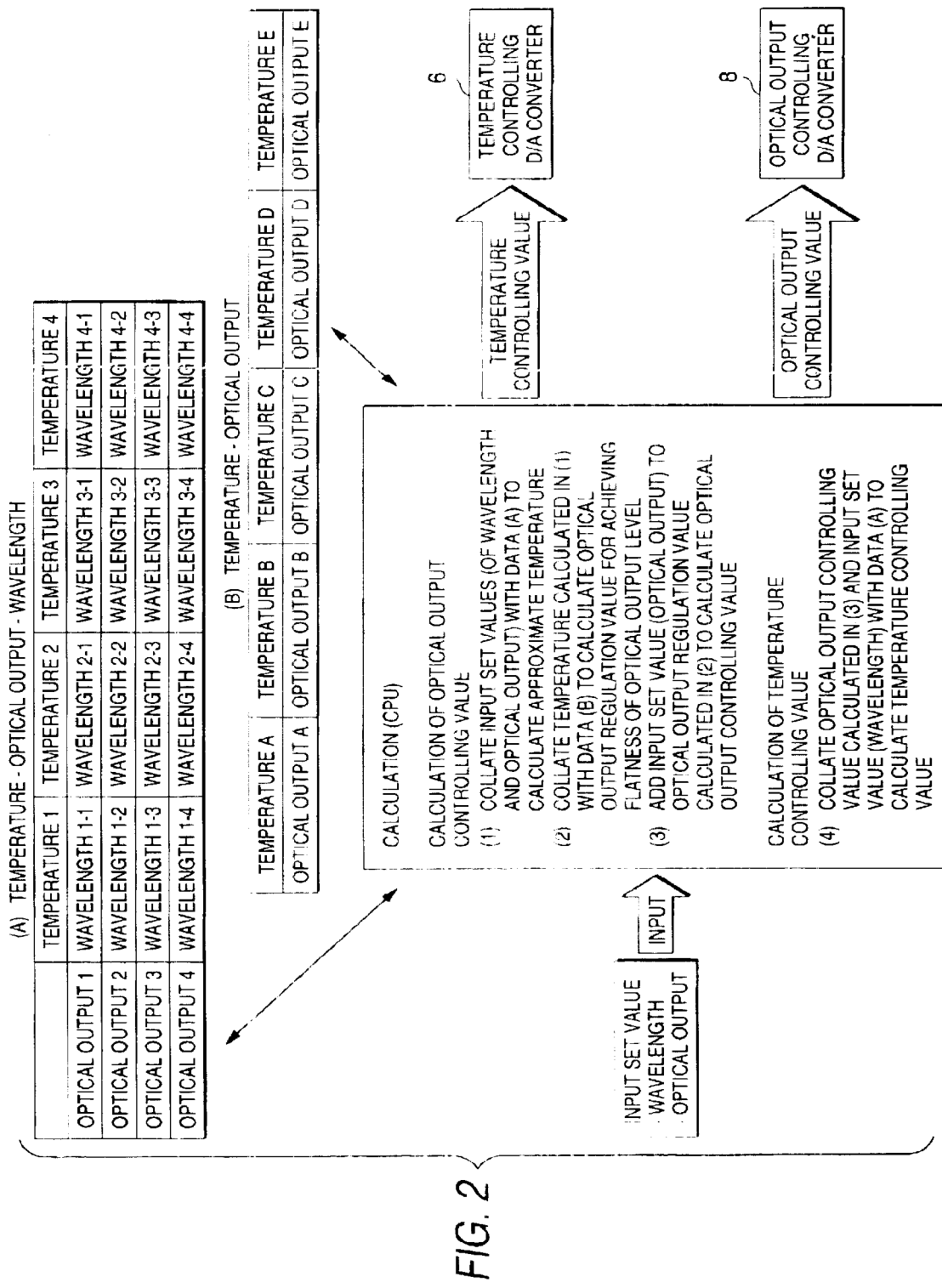
FIG. 2 illustrates temperature control and optical output control in the DFB laser driving device 100 of FIG. 1.

FIG. 2 illustrates temperature control and optical output control in the DFB laser driving device 100.

In FIG. 2, when the set values (of, e.g., the wavelength and the optical output level) of a laser beam radiated from the DFB laser 1 are input from the interface 12 to the CPU 9, the CPU 9 collates the input set values (of, e.g., the wavelength and the optical output level) with data (A) stored in the storage medium 11 inside the storage 10 to calculate an approximate temperature of the DFB laser 1 ((1) in FIG. 2).

Here, the data (A) is measurement data of the wavelength when the temperature of the DFB laser 1 and the optical output level of the DFB laser 1 are varied as parameters.

Subsequently, the CPU 9 collates the above-described approximate temperature with data (B) to calculate an optical output regulation value of the DFB laser 1 for obtaining flatness of the optical output level ((2) in FIG. 2).

Here, the data (B) represents a relationship between temperature of the DFB laser 1 and the optical output level of the DFB.

Furthermore, the CPU 9 calculates an optical output controlling value by performing an arithmetic operation including addition and subtraction based on the optical output regulation value calculated in (2) in FIG. 2 and the input set value (the optical output level) ((3) in FIG. 2) to output the calculated optical output controlling value to the optical output controlling D/A converter 6, thereby controlling the optical output level.

Subsequently, the CPU 9 collates the optical output controlling value calculated in (3) in FIG. 2 and the input set value (the wavelength) with the data (A) to calculate the temperature controlling value of the DFB laser 1 ((4) in FIG. 2), and thus, outputs the calculated temperature controlling value to the temperature controlling D/A converter 8, thereby controlling the temperature of the DFB laser 1.

Figure 3:
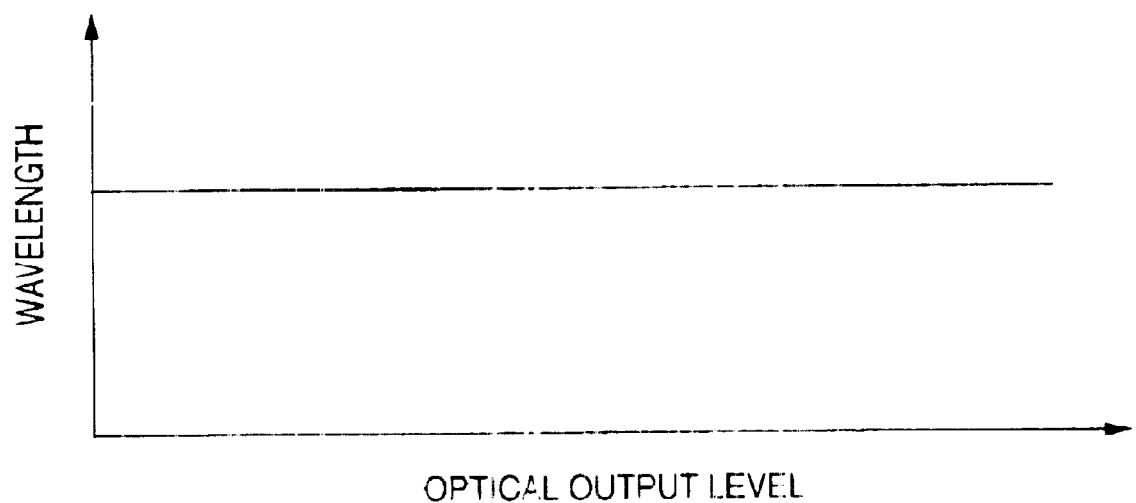
FIG. 3 is a graph illustrating the output characteristics of a DFB laser 1 in the DFB laser driving device 100 of FIG. 1.
Figure 4:
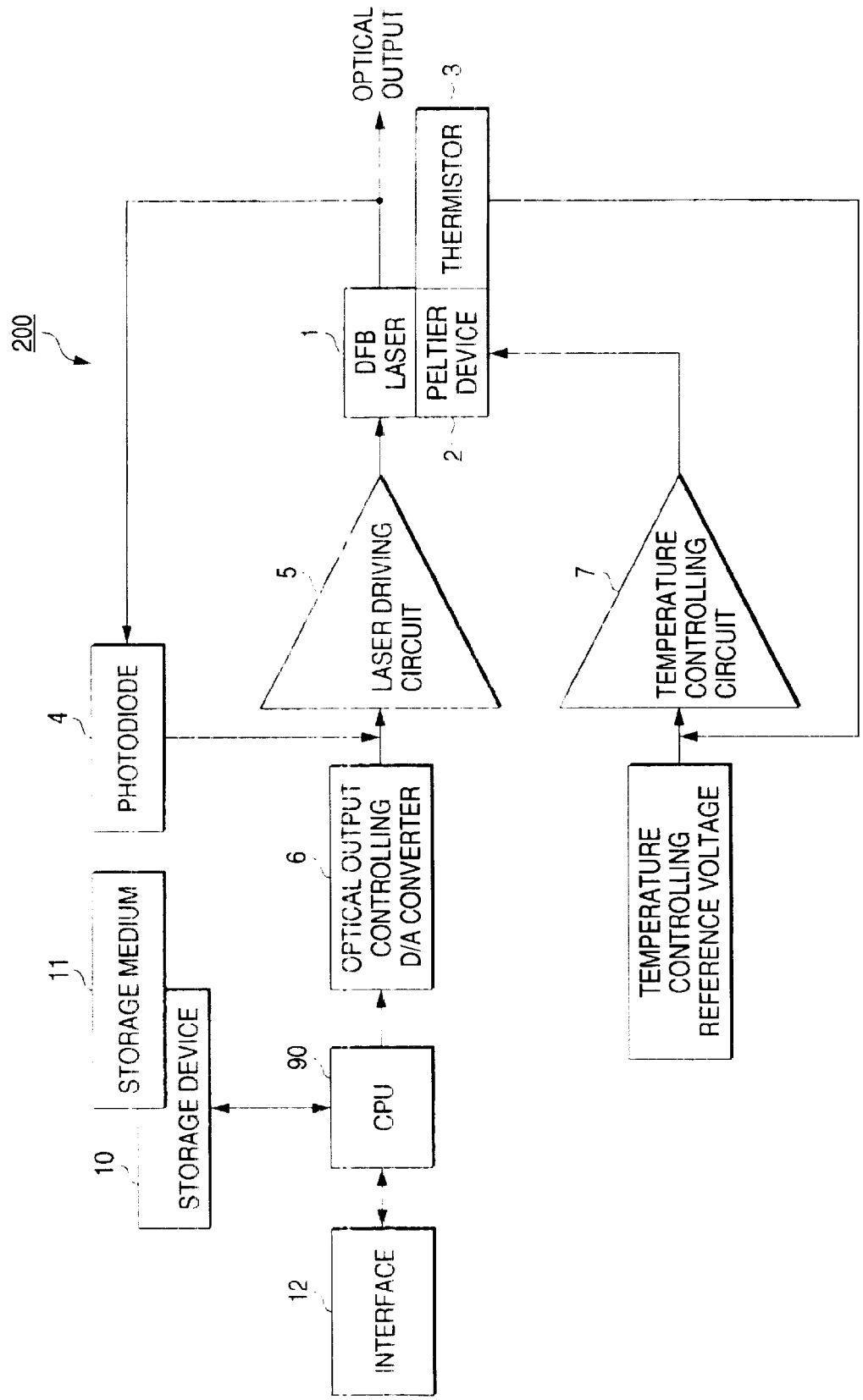
FIG. 4 is a block diagram illustrating the configuration of a DFB laser driving device 200 according to the related art.
Figure 6:
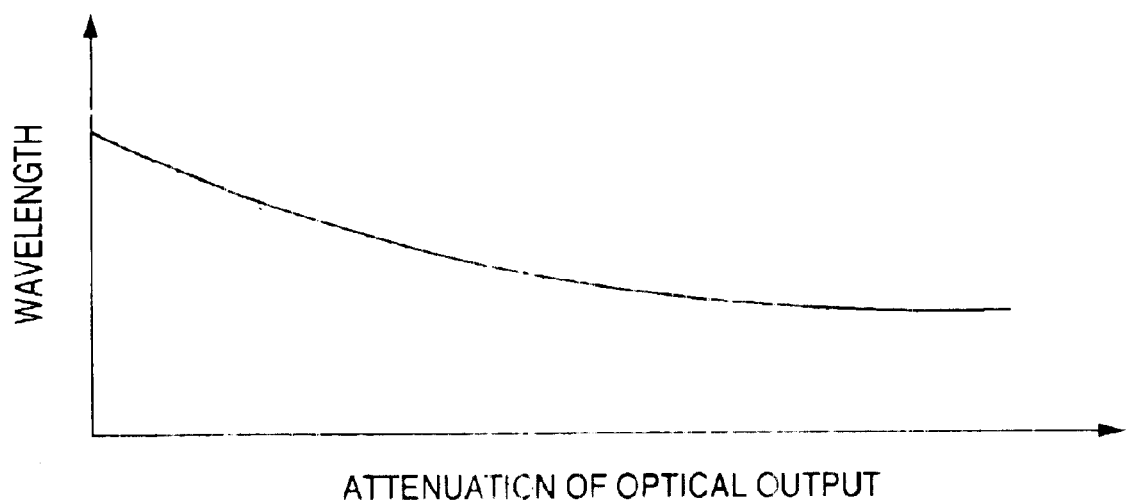
FIG. 6 is a graph illustrating the output characteristics of the DFB laser 1 in the DFB laser driving device 200 according to the related art.

As illustrated in FIG. 3, the optical output level of the DFB laser 1 can be regulated without shifting the set wavelength by the above-described optical output control and temperature control. That is, the flatness of the wavelength can be achieved in the DFB laser driving device 100 according to the present invention even if the optical output level of the DFB laser 1 is regulated.

Furthermore, the reason why the temperature controlling value is calculated after calculating the optical output controlling value is that the change in wavelength in the case where the optical output level of the DFB laser 1 is varied is smaller than that in the case where the temperature is varied. Therefore, it is possible to shorten a time required for the regulation of the optical output level of the DFB laser 1.

As described above, the CPU 9 calculates the optical output controlling value by the use of both of the data (A) and (B) stored in the storage medium 11 upon receipt of the input set values (the wavelength and the optical output level) from the interface 12 (the outside equipment), and then, outputs the calculated optical output controlling value to the optical output controlling D/A converter 8 so as to control the optical output level of the DFB laser 1. Furthermore, the CPU 9 calculates the temperature controlling value by the use of the data (A) to output the calculated temperature controlling value to the temperature controlling D/A converter 6 so as to control the temperature of the DFB laser 1.

Consequently, the optical output level of the DFB laser 1 can be regulated by performing the temperature control after the performing optical output control without shifting the wavelength as the input set value.

Moreover, if the DFB laser driving device 100 according to the present invention is used in the DWDM communication system, it is possible to strictly control the wavelength and optical output level of the laser beam radiated from the DFB laser 1 as the carrier signals. Therefore, the DWDM communications can be implemented with high accuracy.

Incidentally, although each of the optical output control and the temperature control is performed once in the above-described embodiment, each of the controls may be performed a plurality of times. In such a case, the optical output level and wavelength of the DFB laser 1 can be controlled with higher accuracy.

Thus, according to the present invention, the output level is controlled in consideration of the change in temperature of the DFB laser, thereby strictly controlling the output level of the DFB laser.

Furthermore, the wavelength of the DFB laser can be prevented from being shifted by controlling the temperature of the DFB laser after controlling the output level, thereby strictly controlling the wavelength.

What is claimed is:

1. A DFB laser driving device for driving a DFB laser to output optical signals having a predetermined wavelength an a predetermined output level, the DFB laser driving device comprising:

an input unit adapted to input set values of a wavelength and an output level;

an approximate temperature calculating section adapted to calculate an approximate temperature of the DFB laser based on the set values of the wavelength and output level;

an output level variation calculating section adapted to calculate an output level variation of the DFB laser based on the approximate temperature;

an output level controlling section adapted to calculate a value based on the output level variation and the set value of the output level, so as to control the output level of the DFB laser based on the calculated value; and a temperature controlling unit adapted to calculate a set temperature of the DFB laser based on the calculated value and the set value of the wavelength so as to control the temperature of the DFB laser based on the set temperature of the DFB laser.

2. A method for driving a DFB laser to output optical signals having a predetermined wavelength and a predetermined output level, the method comprising:

inputting set values of a wavelength and a output level;

calculating an approximate temperature of the DFB laser based on the set values of the wavelength and output level;

calculating an output level variation of the DFB laser based on the approximate temperature;

calculating a value based on the output level variation and the set value of the output level;

controlling the output level of the DFB laser based on the calculated value;

calculating a set temperature of the DFB laser based on the calculated value and the set value of the wavelength; and controlling the temperature of the DFB laser based on the set temperature.

3. An article comprising a storage medium storing therein a program, which is executable by a computer, for driving a DFB laser to output optical signals having a predetermined wavelength and a predetermined output level, the program for causing the computer to: input set values of a wavelength and a output level; calculate an approximate temperature of the DFB laser based on the set values of the wavelength and output level; calculate an output level variation of the DFB laser based on the approximate temperature; calculate a value based on the output level variation and the set value of the output level to obtain calculated value; control the output level of the DFB laser based on the calculated value; calculate a set temperature of the DFB laser based on the calculated value and the set value of the wavelength; and control the temperature of the DFB laser based on the set temperature.

* * * * *